United States Patent
Agrawal et al.

(10) Patent No.: US 7,487,480 B1
(45) Date of Patent: Feb. 3, 2009

(54) METHOD FOR ESTIMATING AGGREGATE LEAKAGE OF TRANSISTORS

(75) Inventors: Bhavna Agrawal, Milton, NY (US); David J. Hathaway, Underhill, VT (US); Peng Peng, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/118,857

(22) Filed: May 12, 2008

(51) Int. Cl.
*G06F 17/50* (2006.01)
*G06F 17/17* (2006.01)
*G06F 17/11* (2006.01)

(52) U.S. Cl. .................. 716/5; 703/2; 703/16
(58) Field of Classification Search ............ 716/5; 703/2, 16
See application file for complete search history.

(56) References Cited

U.S. PATENT DOCUMENTS

| | | |
|---|---|---|
| 2005/0034089 A1 | 2/2005 | McGuffin et al. |
| 2007/0070783 A1* | 3/2007 | Lee .................. 365/230.06 |
| 2007/0250797 A1 | 10/2007 | Engel et al. |
| 2008/0209371 A1* | 8/2008 | Muraya et al. .................. 716/5 |

OTHER PUBLICATIONS

Sathanur et al., "Efficient Computation of Discharge Current Upper Bounds for Clustered Sleep Transistor Sizing", 2007 Design, Automation & Test in Europe Conference & Exhibition, Apr. 16-20, 2007, pp. 1-6.*
Shi et al., "Sleep Transistor Design and Implementation—Simple Concepts Yet Changes to be Optimum", 2006 International Symposium on VLSI Design, Automation and Test, Apr. 2006, pp. 1-4.*

* cited by examiner

*Primary Examiner*—Phallaka Kik
(74) *Attorney, Agent, or Firm*—Cantor Colburn LLP; Ryan Simmons

(57) ABSTRACT

A method of estimating a leakage for a plurality of transistors in an integrated circuit that accounts for narrow channel effects includes determining an expected total leaking transistor width for the collection; determining an expected total number of leaking transistors for the collection; determining an average width of a leaking transistor from the expected total leaking transistor width and expected total number of leaking transistors; estimating a leakage for a transistor of the average width; and determining the estimated leakage for the collection of transistors by multiplying the leakage for a transistor of the average width by the expected total number of leaking transistors for the collection.

1 Claim, 1 Drawing Sheet

METHOD FOR ESTIMATING AGGREGATE LEAKAGE OF TRANSISTORS

BACKGROUND OF THE INVENTION

This invention relates generally to transistors, and more particularly to estimating the amount of current leakage by a plurality of transistors included on an integrated circuit.

Leakage is becoming a very significant contributor to power consumption on an integrated circuit (IC) chip. Leakage may be defined as current that is dissipated by a transistor while the transistor is turned off (when its gate to source voltage $V_{gs}$ is below its threshold voltage $V_T$). Accurate estimation of leakage for a particular circuit on a chip or a certain portion of a chip containing many circuits (a functional unit) is necessary for an accurate estimate of the power consumption of a chip. Leakage calculations across a variety of conditions (process corners, supply voltages, temperatures, etc.) are required for an accurate estimate and may include consideration of leakage variation or statistics among transistors. Computation of leakage of a single transistor at any particular set of conditions may involve expensive computation, especially if it must be repeated for all transistors and conditions.

For efficiency, it is therefore desirable to compute parameters from which the aggregate leakage power for a collection of transistors can be computed at a particular set of conditions. A common method for doing this is to sum the widths of the transistors (by transistor type and channel length), and to then compute a leakage per unit width under a particular set of conditions, and multiply that by the total width to get the total leakage.

Not all transistors on a chip (or in a region of a chip), however, are leaking at the same time. Thus, to compute the average leakage of such a region, the probability that a transistor is leaking is multiplied by the leakage for each transistor. In the prior art method described above this means multiplying the device widths by their leakage probabilities before summing them.

There are various modes of transistor leakage (channel leakage, gate leakage under different source and drain conditions), and all can be treated in a similar manner (albeit with different leakage probabilities). For simplicity the following discussion will not distinguish among them and simply refer to the combined effects as leakage. In practice the inventive method described below could be applied separately to each of these leakage modes, using the corresponding leakage probabilities.

As one of skill in the art will realize, while a transistor may be represented schematically as being a single transistor of a certain width, the transistor may actually be formed of several parallel connected physical transistors (i.e. with all gates connected together, all drains connected together, and all sources connected together) having individual widths that are smaller than the total but, when summed, equal the total width of the transistor as a whole. These parallel transistors are so-called "finger transistors."

A limitation of prior art methods is that leakage per unit width of narrow transistor is larger than that for wider transistors. This is an aspect of Narrow Channel Effect (NCE). Thus, simply summing the transistor widths and multiplying by a single leakage per unit width number will give inaccurate (and generally under-estimated) leakage values, because the leakage of a transistor is not strictly proportional to width.

By considering the physical structure of the transistor it may be observed that leakage per transistor must be very close to linear with width for wide devices. If a transistor is wide enough that its end regions do not interact with each other (i.e., there is no lithographic, process, or electrical field impact of one end on the other), then any given segment of the "middle" region of the transistor will have the same leakage as any other equal width segment, and the total leakage will simply be the sum of the end region leakages and the width of the middle region times its leakage per unit width.

One prior art method for accounting for NCE leakage is to compute the leakage for each transistor, multiply it by the probability that the transistor is leaking, and add these probability-weighted leakages across all transistors in the chip or circuit whose leakage is to be computed. Mathematically, if W=width, p=leakage probability, L=leakage, and leakage (W) is the leakage calculation function for a single transistor of width W:

$$L_i = p_i * \text{leakage}(W_i)$$

$$L_{total} = \Sigma L_i$$

This method, however, requires that the potentially expensive leakage computation be repeated for all transistors in the design at each condition for which leakage computation is required.

Another prior art method for accounting for NCE leakage is to determine the average transistor width (from the total transistor count and total un-weighted transistor width), in addition to the total leakage probability-weighted transistor width. The leakage per unit width can then be determined based on the average transistor width, allowing some accounting for NCE. Mathematically, if N=transistor count and W, p, L, and leakage(W) are as above:

$$W_{total} = \Sigma W_i$$

$$W_{weighted} = \Sigma(W_i * p_i)$$

$$L_{total} = (W_{weighted}/W_{total}) * N * \text{leakage}(W_{total}/N)$$

If the leakage probabilities of different width transistors are different, however, this method can be inaccurate in the presence of NCE. The following example gives an example of how such calculations may be inaccurate. In this example, two different cases related to two transistors, tx1 and tx2, having different widths $w_1$ and $w_2$, under two different probability cases, case a (with only tx1 leaking) and case b (with only tx2 leaking) are considered.

case a: $W_{total} = w_1 + w_2$ $W_{weighted} = w_1$ $L_{total} = (w_1/(w_1+w_2)) * 2 * \text{leakage}((w_1+w_2)/2)$ case b: $W_{total} = w_1 + w_2$ $W_{weighted} = w_2$ $L_{total} = (w_2/(w_1+w_2)) * 2 * \text{leakage}((w_1+w_2)/2)$ If leakage were proportional to width (i.e., leakage(W) =K*W), the prior art aggregate leakages would be exactly correct:

case a: $L_{total} = (w_1/(w_1+w_2)) * 2 * K * (w_1+w_2)/2 = w_1 * K$ case b: $L_{total} = (w_2/(w_1+w_2)) * 2 * K * (w_1+w_2)/2 = w_2 * K$ But if leakage is linear with width but not proportional to it (i.e., leakage (W) = $L_0 + K*W$) the aggregate leakages will not be correct:

$$L_{total} = (w_1/(w_1+w_2))*2*(L_0+K*(w_1+w_2)/2) \quad \text{case a}$$
$$= 2*L_0*w_1/(w_1+w_2)+w_1*K$$
$$\neq L_0+w_1*K$$

$$L_{total} = (w_2/(w_1+w_2))*2*(L_0+K*(w_1+w_2)/2) \quad \text{case b}$$
$$= 2*L_0*w_2/(w_1+w_2)+w_2*K$$
$$\neq L_0+w_2*K$$

Thus there is a need for a method of aggregating transistor parameters to allow accurate computation of aggregate leakage that accounts for NCE.

BRIEF SUMMARY OF THE INVENTION

An exemplary embodiment includes a method of estimating a leakage for a plurality of transistors in an integrated circuit that accounts for narrow channel effects. The method of this embodiment includes determining an expected total leaking transistor width for the plurality of transistors; determining an expected total number of leaking transistors for the plurality of transistors; determining an average width of a leaking transistor from the expected total leaking transistor width and expected total number of leaking transistors; estimating a leakage for a transistor of the average width; and determining the estimated leakage for the plurality of transistors by multiplying the leakage for a transistor of the average width by the expected total number of leaking transistors for the collection.

BRIEF DESCRIPTION OF THE DRAWINGS

Referring now to the drawings wherein like elements are numbered alike in the FIGURE.

DETAILED DESCRIPTION OF EXEMPLARY EMBODIMENTS

Figure 1:
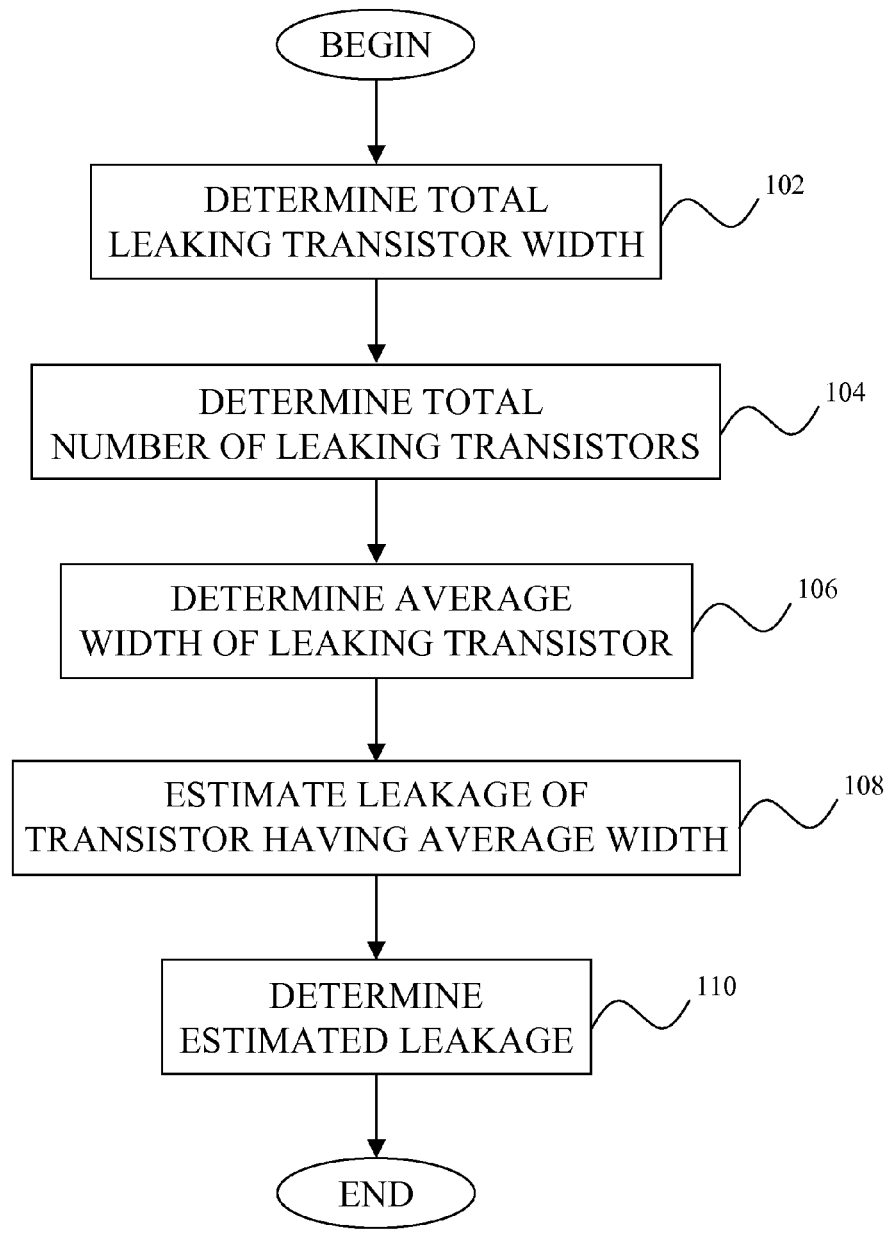
FIG. 1 is a flow diagram of one embodiment of a method according to the present invention.

One embodiment of present invention is directed to a method for estimating a leakage for a plurality of transistors in an integrated circuit that accounts for narrow channel effects. The method includes determining an expected total leaking transistor width for the plurality of transistors and determining an expected total number of leaking transistors for the plurality of transistors. The method also includes determining an average width of a leaking transistor from the expected total leaking transistor width and expected total number of leaking transistors and estimating a leakage for a transistor of the average width. The method also includes determining the estimated leakage for the collection of transistors by multiplying the leakage for a transistor of the average width by the expected total number of leaking transistors for the collection.

An exemplary embodiment of the present invention provides a method by which both a leakage probability-weighted sum of transistor widths (as in the prior art), and also a leakage probability-weighted sum of the transistor count, are taken into account. The leakage (including NCE effects) can then be computed for the average leaking transistor width, instead of simply the average transistor width. Having an accurate measure of leakage as determined by present invention provides a result from which the power consumption of a circuit or other portion of an integrated circuit may be estimated.

An embodiment of the present invention may be expressed generally, in mathematical terms (with W=width, N=count, p=leakage probability, L=leakage, and leakage(W) being the leakage calculation function for a single transistor of width W) as follows:

$$W_{total} = \Sigma(W_i * p_i)$$

$$N_{total} = \Sigma p_i$$

$$L_{total} = N_{total} * \text{leakage}(W_{total}/N_{total})$$

The above estimation method can also be applied to multi-fingered devices, where the number of fingers in device i is $N_i$. Such an estimate simply requires changing the definition of $N_{total}$ to $\Sigma(p_i * N_i)$. Furthermore, hierarchical aggregation of leakage parameters (e.g., aggregating at the chip level previously aggregated values for various sections or levels on the chip) can also be computed by summing the $W_{total}$ and $N_{total}$ values for the various lower level aggregations to get the higher level aggregation.

Hierarchical conditional leakage probabilities can also be handled. Consider a two level hierarchy, where the probability that transistor i in portion x of the IC is leaking given that portion x is active is $p_i$, and these probabilities and the widths and finger counts of transistors in portion x are used to obtain weighted aggregate width and count values $W_{total-x}$ and $N_{total-x}$. Examples of portions may include, for instance, an AND gate that includes several transistors, or an entire processor core that includes millions of transistors. If the probability that the portion x is on is $p_j$, the weighted contributions of portion x to the chip level aggregate $W_{total}$ and $N_{total}$ will then be $p_j * W_{total-x}$ and $p_j * N_{total-x}$. Similarly, if a portion x can operate in n different modes with probabilities $p_i \ldots p_n$, and a given transistor j has a probability $P_{ij}$ of leaking given that macro x is mode i, the leakage contributions of all transistors in x can be aggregated into n width / count pairs (Wi, Ni) for each operational mode i, and the total macro leakage across all modes can then be modeled by:

$$W_x = W_i * p_i (i=1 \ldots n)$$

$$N_x = \Sigma N_i * p_i (i=1 \ldots n)$$

FIG. 1 shows a block diagram of a method according to one embodiment of the present invention. At block 102, an expected total leaking transistor width for a plurality of transistors is determined. The expected total leaking transistor width for the plurality of transistors may be determined according to the relation $W_{total} = \Sigma(W_i * p_i)$ where $W_i$ is the width of transistor i and $p_i$ is the probability that the transistor i is active (i.e., the probability that the transistor i is leaking). As one of skill in the art will realize, the probability that a particular transistor ($p_i$) is leaking may be determined, for example, by simulating operation of a chip using computer simulation techniques (such as a Spice or logic simulation) for a specified time period and examining the portion of the time period a particular transistor was leaking (i.e., the portion of the time the transistor was inactive).

At block 104, the expected total number of leaking transistors for the collection is determined. As described above, the probability that each transistor is running may be determined by computer simulation. The expected total number of leaking transistors, $N_{total}$, is the sum of the probabilities that each transistor is leaking ($\Sigma p_i$).

At block 106, an average width of a leaking transistor is determined from the expected total leaking transistor width and expected total number of leaking transistors. The average width may be determined, for example, by solving $W_{total}/N_{total}$.

At block 108, an estimate of the leakage of a transistor of the average width is made. In one embodiment, this may be done by consulting a compact model of a transistor. As one of skill in the art will realize, the compact model may include a relationship between a transistor width and its leakage at certain fixed conditions. If the conditions change, this leakage of a transistor of average width may easily be varied by creating (for example, in a computer simulation) a new relationship based on the new conditions. This may allow, in some embodiments, for estimates of aggregate leakage to be made over wide condition variations by only solving the leakage for only one value, the average width of leaking transistor.

At block 110 an estimated leakage for the plurality of transistors is determined by multiplying the leakage for a transistor of the average width by the expected total number of leaking transistors for the collection.

It will be understood by those of skill in the art that an integrated circuit will contain different types of transistors that will have different leakage as a function of width. For example, an integrated circuit will generally contain both NFETs and PFETs, and may include different channel lengths or different threshold variations for each. Furthermore, different transistors on the integrated circuit may be connected to different power supplies operating at different voltages, and hence the leakage as a function of width of such transistors will differ, even for transistors of the same type. Finally, variations in environmental conditions (e.g., temperature) may occur across the chip, and transistors far apart may therefore exhibit different leakage as a function of width. The inventive method will therefore preferentially be applied separately to each type of transistor and power supply voltage, and may be applied separately to transistors in different regions of the integrated circuit.

Although transistor leakage is generally close to linear with transistor width, there may be slight deviation from linearity at very narrow widths, where the leakage of the two ends of the transistor may interact. To provide a more precise estimate of aggregate leakage in such cases, the range of transistor widths may be divided into two or more sub-ranges, and the inventive process may be applied separately to transistors in each of these sub-ranges. For example, if the two sub-ranges are defined for transistors wider and narrower than 1 micron, and a portion of a design for which aggregate leakage is to be computed includes 10,000 transistors of width less than 1 micron and 40,000 transistors of width greater than 1 micron, a first ($W_{total}$, $N_{total}$) pair may be computed and used according to the method of FIG. 1 to estimate aggregate leakage for all transistors of width less than one micron, and a second ($W_{total}$, $N_{total}$) pair may be computed and used according to the method of FIG. 1 to estimate aggregate leakage for all transistors of width greater than one micron, the sum of these two aggregate leakages being the overall aggregate leakage of the design portion.

The embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method of estimating a leakage for a plurality of transistors in an integrated circuit that accounts for narrow channel effects, the method comprising:

determining an expected total leaking transistor width for the plurality of transistors;

determining an expected total number of leaking transistors for the plurality of transistors;

determining an average width of a leaking transistor from the expected total leaking transistor width and the expected total number of leaking transistors;

estimating a leakage for a transistor of the average width; and determining the estimated leakage for the plurality of transistors by multiplying the leakage for a transistor of the average width by the expected total number of leaking transistors for the plurality of transistors.

* * * * *